(12) United States Patent
Miller, III et al.

(10) Patent No.: US 6,515,060 B2
(45) Date of Patent: Feb. 4, 2003

(54) SOLID SURFACE SHEET MATERIALS CONTAINING SYNTHETIC MICA

(75) Inventors: Richard C. Miller, III, Ransomville, NY (US); Laura A. McCumber, Grand Island, NY (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/794,812

(22) Filed: Feb. 27, 2001

(65) Prior Publication Data

US 2002/0161094 A1 Oct. 31, 2002

(51) Int. Cl.⁷ .............................. C08K 3/10; C08K 3/34
(52) U.S. Cl. ...................... 524/436; 524/434; 524/437; 524/449
(58) Field of Search ................................ 524/434, 436, 524/437, 449

(56) References Cited

U.S. PATENT DOCUMENTS

| | | | |
|---|---|---|---|
| 3,570,056 A | | 3/1971 | Hall et al. |
| 3,600,490 A | | 8/1971 | Billingsley et al. |
| 3,847,865 A | | 11/1974 | Duggins et al. |
| 4,406,662 A | * | 9/1983 | Beram et al. .................. 8/471 |
| 4,413,089 A | | 11/1983 | Gavin et al. |
| 4,480,060 A | | 10/1984 | Hoda et al. |
| 5,094,852 A | | 3/1992 | Ohno et al. |
| 5,741,355 A | * | 4/1998 | Yamamoto et al. ......... 106/417 |
| 5,947,804 A | | 9/1999 | Fukinuki et al. |

FOREIGN PATENT DOCUMENTS

WO  WO 98/38244  9/1998

* cited by examiner

Primary Examiner—Kriellion Sanders

(57) ABSTRACT

The subject invention provides a solid surface sheet material having excellent physical properties and a lustrous, sparkling appearance which comprises an acrylic resin, from about 20 to about 75% by weight of a filler and from about 0.1 to about 30% by weight of synthetic mica.

7 Claims, No Drawings

SOLID SURFACE SHEET MATERIALS CONTAINING SYNTHETIC MICA

BACKGROUND OF THE INVENTION

This invention relates to solid surface sheet material having improved physical and aesthetic properties. More particularly, the invention relates to providing solid surface sheet material comprised of highly filled acrylic resin containing a controlled amount of a selected synthetic mica.

U.S. Pat. No. 4,480,060 discloses composite pressed boards containing at least 50% mica mixed with an organic resin such as epoxy, polyimide, melamine or phenolic resin. The boards are useful in electrical applications and have an opaque, lusterless appearance.

International Publication WO98/38244, published Sep. 3, 1998 discloses products said to contain oriented pearlescent flakes of mica.

The inclusion of natural occurring mica with resins and fillers in preparing composite materials is disclosed in general terms in a number of publications.

SUMMARY OF THE INVENTION

The subject invention provides a solid surface sheet material having excellent physical properties and a lustrous, sparkling appearance which comprises an acrylic resin, from about 20 to about 75% by weight of a filler, based on the total weight of the material, and from about 0.1 to about 5% by weight of a selected synthetic mica based on total weight of the material.

DETAILED DESCRIPTION OF THE INVENTION

The resins useful in the present invention are not specially limited as long as they can be formed into a solid surface material by curing. Examples of useful acrylic resins include various kinds of conventional acrylic group monomers, acrylic group partial polymers, vinyl monomers for copolymerization other than acrylic group monomers, or oligomers. As the arylic group monomer, (meth)acrylic ester is preferable.

A particularly good and especially preferred polymer which meets all of the above properties is poly(methyl methacrylate). In a castable composition, it is often introduced as a sirup of polymer in methyl methacrylate monomer. Methods of preparing such a sirup are described in the prior art. Another method of preparing a sirup is to simply dissolve polymer in the monomer. This latter method is quite useful for adjusting viscosity of the castable composition since molecular weight of polymer as well as concentration can be varied in such a way as to control the rheology.

The amount of fluid polymerizable constituent required in the castable composition is at least 30% by volume. Methyl methacrylate monomer is preferred as a major constituent.

Other monomers useful as fluid polymerizable constituents are alkyl acrylates and methacrylates in which the alkyl groups can be from 1–18 carbon atoms, but preferably 1–4 carbon atoms. Suitable acrylic monomers are methyl acrylate; ethyl acrylate and methacrylate; n-propyl and i-propyl acrylates and methacrylates; n-butyl, 2-butyl, i-butyl and t-butyl acrylates and methacrylates; 2-ethylhexyl acrylate and methacrylate; cyclohexyl acrylate and methacrylate; omega-hydroxyalkyl acrylates and methacrylates; N,N-dialkylaminoalkyl acrylates and methacrylates; N-[t-butyl] aminoethyl acrylate and methacrylate.

Other unsaturated monomers include such compounds as bis-[beta-chloroethyl]vinylphosphonate; styrene; vinyl acetate; acrylonitrile; methacrylonitrile; acrylic and methacrylic acids; 2-vinyl- and 4-vinylpyridines; maleic acid, maleic anhydride and esters of maleic acid; acryl amide and methacrylamide; itaconic acid, itaconic anhydride and esters of itaconic acid and multifunctional monomers for crosslinking purposes such as unsaturated polyesters; alkylene diacrylates and dimethacrylates; allyl acrylate and methacrylate; N-hydroxymethylacrylamide and N-hydroxymethylmethacrylamide; N,N'-methylene diacrylamide and dimethacrylamide; glycidyl acrylate and methacrylate; diallyl phthalate; divinylbenzene; divinyltoluene; trimethylolpropane triacrylate and trimethacrylate; pentaerythritol tetraacrylate and tetramethacrylate; triallyl citrate and triallyl cyanurate.

The synthetic mica useful in providing the products of this invention are fluoro-phlogopites such as $KMg_3(AlSi_3O_{10})F_2$. They are described in detail and a process for their preparation is disclosed in U.S. Pat. No. 5,094,852 which is incorporated herein by reference. Other useful forms of synthetic include fluoro-tetrasilicicmica $(KMg_{2.5}Si_4O_{10})F_2$, sodium-fluoro-tetrasilicicmica $(NaMg_{2.5} Li(Si_4O_{10})F_2$, sodium-taeniolite $(NaMg_2Li(Si_4O_{10})F_2$, and fluoro-hectorite $Na_{1/3}Mg_{8/3}Li_{1/3}(Si_4O_{10})F_2$.

Fillers useful in the present invention include, for example, aluminum trihydrate, calcium carbonate, barium sulfate, Bayer hydrate, magnesium hydroxide, talc, wolastonite, as a list that is not exhaustive and not intended to limit the invention. Fillers can be present in effective amounts from as low as about 20% by weight to about 75% by weight. Preferably, amounts from 30 to 67% by weight are used.

It is known to include in solid surface materials other additives such as pigments, dyes, flame retardant agents, parting agents, fluidizing agents, viscosity control agents, curing agents (chemical and thermal), antioxidants, toughening agents and the like as known to those of ordinary skill in the art.

Solid surface materials of this invention can be prepared by cell cast, continuous casting or by reactive extrusion using a multi-feeder twin-screw extruder equipped with vacuum and a sheet die of proper dimensions. The sheets produced can be transferred either onto a double belt press or into an oven for curing. The preferred method is continuous casting. The production of filled poly(methyl methacrylate) compositions is well known in the art, see for instance U.S. Pat. Nos. 3,847,865; 4,413,089; and 4,406,662, which are hereby incorporated by reference. Light pressure may be needed for maintaining sheet gauge or profile during curing. The resulting solid surface material is thermoformable.

The invention can be further understood by reference to the following examples in which parts and percentages are by weight unless otherwise indicated.

EXAMPLES

Example 1

Alumina trihydrate, approximately 60% by weight, was mixed with ingredients a. through f. as shown in Table 1 at a temperature of 27–29 deg C. After mixing for 1 minute, approximately 0.3 parts per hundred of water (based on the weight of the sirup) was added to the mixture. The mixture was then evacuated under vacuum (24–25 in Hg) using a pump and a suitable condensing vapor trap. At 3½ minutes and 4½ minutes into the evacuation, small amounts of calcium hydroxide and ethylene glycol dimercaptoacetate (GDMA) were added by syringe. After 5 minutes of total mixing and evacuation, the mixture was poured into a container of square design to form a layer of approximately ½" thickness and allowed to cure.

One control article (Control A) and four "synthetic mica containing" articles were made using the described procedure. In Control A, the pearlescent pigment was a 22% solids dispersion of natural mica (muscovite) in butylmethacrylate (BMA). Articles 1–4 used a synthetic fluoro-phlogopite mica (SH-100) purchased from TOPY Industries (dry) with an adjustment in sirup to account for the residual BMA.

lated in Table 2. It will be noted that the structures containing synthetic mica support greater loads (lbs) and stresses (psi) prior to yield and increased force (energy) to break. In addition to increased strength, it was also noted that samples 2–4 displayed greater visual pearlescence than the control despite the lower levels of mica pigment (solids basis). Samples 2–5 were also found to be free of objectionable reddish-brown contamination present in the control sample and in the mica supplied by EM Industries (Ruby muscovite).

TABLE 1

Articles 1 Control A, Articles 2–5 Synthetic Mica

|  | (1) Control A | (2) Synthetic Article #1 | (3) Synthetic Article #2 | (4) Synthetic Article #3 | (5) Synthetic Article #4 |
|---|---|---|---|---|---|
| a. Alumina Trihydrate (ATH)* | 59.9% | 59.9% | 60.0% | 59.7% | 60.3% |
| b. Sirup (24% PMMA in MMA) | 31.8% | 34.2% | 34.2% | 34.2% | 34.2% |
| c. MMA Monomer | 2.9% | 2.9% | 2.9% | 2.9% | 2.9% |
| d. PMA 25 paste (t-butylperoxy maleic acid) | 0.9% | 0.9% | 0.9% | 0.9% | 0.9% |
| e. Trimethylol propane trimethacrylate (TRIM) | 0.3% | 0.3% | 0.3% | 0.3% | 0.3% |
| f. Dioctyl sodium sulfosuccinate | 0.1% | 0.1% | 0.1% | 0.1% | 0.1% |
| g. Phosphated propylene glycol methacrylate | 0.1% | 0.1% | 0.1% | 0.1% | 0.1% |
| h. Ca(OH)$_2$ Slurry (34% in sirup) | 0.3% | 0.3% | 0.3% | 0.3% | 0.3% |
| I. Ethylene glycol dimercapto acetate (GDMA) | 0.1% | 0.1% | 0.1% | 0.1% |  |
| j. Distilled Water | 0.1% | 0.1% | 0.1% | 0.1% | 0.1% |
| k. Yellow Pigment Dispersion # PC-9Y139 (0.1% in Sirup)** | 0.4% | 0.4% | 0.4% | 0.4% | 0.4% |
| l. White Pigment Dispersion # PC-11W1185** | 0.2% | 0.2% | 0.2% | 0.2% | 0.2% |
| m. Muscovite Natural Pearl Dispersion #PC-9Z319** | 3.0% | — | — | — | — |
| n. Synthetic Pearl Flake | — | 0.6% | 0.5% | 0.8% | 0.2% |
| #SH100 (Ultimica by TOPY) Total: | 100% | 100% | 100% | 100% | 100% |

*From Alcan, particle size 40 microns
**from Penn Color Corp.

Samples 1–4 were tested on a Series IX Automated Materials Testing System (Instron Corporation v4.06) for strength and flexibility. The results of the testing are tabu-

TABLE 2

Flexural 3-Pont Bend Analysis of Samples 1–5:

| Specimen | Stress @ Yield (psi) | Modulus (psi) | Force to to Break (lbs-in) | Strain @ Break (%) | Load at Yield (lbs) |
|---|---|---|---|---|---|
| Sample 1 (Control A) | 8502 | 1276541 | 1.8 | 0.72 | 45.98 |
| Sample 2 (Synthetic Article #1) | 9634 | 1239000 | 2.6 | 0.88 | 51.02 |
| Sample 3 (Synthetic Article #2) | 10240 | 1257000 | 2.9 | 0.93 | 54.27 |
| Sample 4 (Synthetic Article #3) | 9846 | 1286000 | 2.7 | 0.87 | 52.21 |
| Sample 5 (Synthetic Article #4) | 9378 | 1223000 | 2.4 | 0.85 | 49.23 |

Average of Triplicate Readings Shown

Example 2

Articles #5, #6, and Control B were prepared using equivalent methods to that as described above for Example 1, except that large scale, commercial continuous casting equipment and techniques were employed as described in U.S. Pat Nos. 3,570,056 and 3,600,490 which are hereby incorporated by reference. Pigment flows were adjusted to achieve near equal color, pearlescence and appearance.

TABLE 3

Process Conditions and Formulations for Control B, Articles 5 and 6

|  | (6) Control B | (7) Synthetic Article #5 | (8) Synthetic Article #6 |
|---|---|---|---|
| a. Alumina Trihydrate (ATH)* | 60.0% | 60.0% | 60.0% |
| b. Sirup (24% PMMA in MMA) | 32.2% | 34.1% | 34.3% |
| c. MMA Monomer | 2.6% | 2.2% | 2.2% |
| d. PMA 25 paste (t-butylperoxy maleic acid) | 0.8% | 0.8% | 0.8% |
| e. Trimethylol propane trimethacrylate (TRIM) | 0.3% | 0.3% | 0.3% |
| f. Dioctyl sodium sulfosuccinate | 0.2% | 0.2% | 0.2% |
| g. Phosphated propylene glycol methacrylate | 0.1% | 0.1% | 0.1% |
| h. Ca(OH)2 Slurry (34% in sirup) (GDMA) | 0.3% | 0.3% | 0.3% |
| i. Ethylene glycol dimercapto acetate | 0.1% | 0.1% | 0.1% |
| j. Distilled Water | 0.1% | 0.1% | 0.1% |
| k. Yellow Pigment Dispersion #PC-9Y139 (0.2% in Sirup)** | 0.3% | 0.4% | 0.5% |
| l. White Pigment Dispersion #PC-11W1185 (90% in Sirup)** | 0.2% | 0.2% | 0.2% |
| m. Muscovite Natural Pearl Dispersion #PC-9Z319 (22% in BMA)** | 3.0% | — | — |
| n. Synthetic Pearl Flake Dispersion #PC-9Z412 (22% in BMA)** | — | 1.0% | 1.0% |
| Total: | 100% | 100% | 100% |

*particle size 40 mm, from Alcan
**from Penn Color Corp.

Samples 6–8 were tested on a Series IX Automated Materials Testing System (Instron Corporation v4.06) for strength and flexibility. The results of the testing are tabulated in Table 4. It will be noted that the structures containing synthetic mica support greater loads (lbs) and stresses (psi) prior to yield and increased force (energy) to break. Stain resistance (ANSI Z124 for Stain, Chemical, and Cigarette resistance) was improved in addition to Gardner Impact Performance and the ability of this product to resist discoloration at high temperatures using methods such as NEMA-LD-3.3.6. Improved weatherability was demonstrated in ASTM G24 using an Atlas Ci3000 weatherometer for products of this invention over those incorporating natural mica, e.g. reduced discoloration (dECIE94) at equivalent exposure conditions. In addition to increased strength, stain, temperature resistance, impact, and accelerated weatherability, extensive inspection of production found improved cleanliness of the synthetic formulation (reduced objectionable reddish-brown contamination) present in the control samples and in the natural mica formulations supplied by EM Industries (Ruby muscovite). Improved production yields are achieved.

TABLE 4

Analysis of Samples 6–8

|  |  | Sample 6 Natural | Sample 7 Synthetic | Sample 8 Synthetic |
|---|---|---|---|---|
| Appearance | Absolute |  |  |  |
| Color | L' | 89.91 |  | 90.36 |
|  | a' | −0.10 |  | −0.23 |
|  | b' | 5.73 |  | 5.62 |
| Flexural Properties |  |  |  |  |
| Instron/Sintech (Room Temp) | Stress (MPa) | 58.8 | 73.5 | 74.8 |
|  | Modulus (MPa) | 8759 | 9244 | 8305 |
|  | Force to Break (J) | 215 | 346 | 414 |
|  | Strain at Break (%) | 0.7360 | 0.9340 | 1.0590 |
| Physical Properties |  |  |  |  |
| Hardness | Rockwell | 89.0 | 90.3 | 87.7 |
| 25 Item Stain | Sanded finish | 83 | 73 | 77 |
| Gardner Impact (J) |  | 7–9 |  | 9–11 |

L', a' and b' values were obtained employing a Gretag Macbeth® Coloreye® XTH Spectrophotometer using CIELAB: D65-10 RAV-SCI Geometry.

What is claimed is:

1. A highly filled acrylic solid surface sheet material comprising an acrylic resin, from 20 to 75% by weight of a filler and from 0.1 to 30% by weight of a synthetic mica which is a fluoro-phlogopite.

2. The material of claim 1 wherein the acrylic resin is polymethylmethacrylate.

3. The material of claim 1 wherein the synthetic mica is present in an amount from 0.1 to 5% by weight.

4. The material of claim 3 wherein said filler is present in an amount from 30 to 67% by weight.

5. The material of claim 4 wherein the filler is aluminum trihydrate.

6. The material of claim 1 wherein the fluoro-phlogopite is $KMg_3(AlSi_3O_{10})F_2$.

7. A highly filled acrylic solid surface sheet material comprising polymethylmethacrylate resin, from 30 to 67% by weight aluminum trihydrate and from 0.1 to 5% by weight of synthetic fluoro-phlogopite mica.

* * * * *